United States Patent [19]
Hong

[11] Patent Number: 5,357,466
[45] Date of Patent: Oct. 18, 1994

[54] FLASH CELL WITH SELF LIMITING ERASE AND CONSTANT CELL CURRENT

[75] Inventor: Gary Hong, Hsin-Chu, Taiwan

[73] Assignee: United Microelectronics Corporation, Hsin-Chu, Taiwan

[21] Appl. No.: 92,191

[22] Filed: Jul. 14, 1993

[51] Int. Cl.⁵ .............................................. G11C 7/00
[52] U.S. Cl. ................................. 365/185; 365/218
[58] Field of Search ................................. 365/218, 185

[56] References Cited

U.S. PATENT DOCUMENTS

| | | | |
|---|---|---|---|
| 4,317,272 | 3/1981 | Kuo et al. | 257/208 |
| 4,797,856 | 1/1989 | Lee et al. | 365/185 |
| 5,220,528 | 6/1993 | Mielke | 365/218 |

Primary Examiner—Eugene R. LaRoche
Assistant Examiner—Tan Nguyen
Attorney, Agent, or Firm—Meltzer, Lippe, Goldstein, Wolf, Schlissel & Sazer

[57] ABSTRACT

A Flash memory cell has a self-limiting erase to prevent over-erase and delivers a preset constant read current. The memory cell comprises first and second MOS transistors. The first and second transistors have a common source, first and second separate drains, a common floating gate and a common control gate. The first transistor has a higher threshold voltage than the second transistor. The cell is programmable by introducing a charge into the common floating gate. The cell is erasable by applying a voltage to the common source to discharge the floating gate. A feedback path is provided between the drain of the second transistor and the common control gate to limit the discharge to prevent over-erasing. The cell can be read by applying a read voltage to the common control gate. Because the erase is limited due to feedback, and there is no problem with over-erase, the threshold voltage of the first transistor is constant and known, and a preset constant read current is generated between the common source and the drain of the first transistor.

6 Claims, 1 Drawing Sheet

FIG. 1
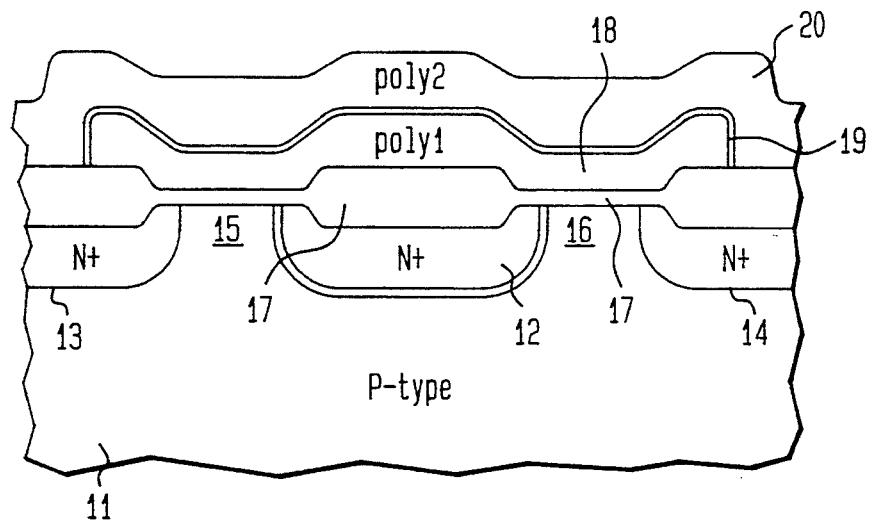
FIG. 2
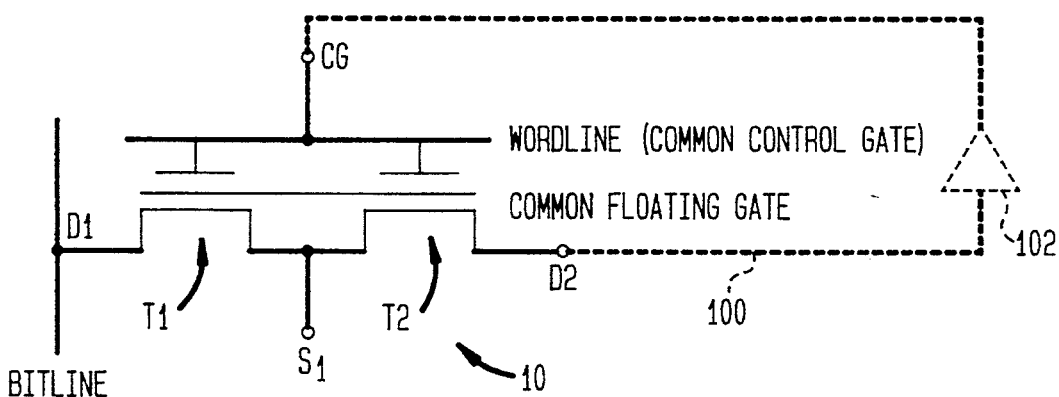
FIG. 3
|  | D1 | D2 | SOURCE | CONTROL GATE |
|---|---|---|---|---|
| PROGRAM | 7V | FLOATING | 0 | 12V |
| ERASE | FLOATING | CONNECTED TO CONTROL GATE | 12V | CONNECTED TO D2 |
| READ | 1V | FLOATING | 0 VOLTS | 5 VOLTS |

FLASH CELL WITH SELF LIMITING ERASE AND CONSTANT CELL CURRENT

FIELD OF THE INVENTION

The present invention relates to a Flash EEPROOM cell. More specifically, the present invention relates to a Flash EEPROM cell with a self limiting erase to prevent over-erasing and which can deliver a preset constant read current.

BACKGROUND OF THE INVENTION

The fabrication of Flash Memories or electrically erasable programmable read only memories (EEPROMs) utilizing metal oxide semiconductor technology is well known in the prior art. These EEPROMs employ memory cells utilizing floating gates which are generally formed from polysilicon and which are completely surrounded by an insulator. Electrical charge is transferred into and removed from the floating gate to control the threshold voltage of one or more MOS transistors in a memory cell. The floating gate is programmed when a charge is stored in the floating gate. The cell is in an unprogrammed or erase state, when the floating gate is discharged.

One problem with the single transistor Flash cell or single-transistor EEPROM cell is the over-erase problem. An over-erase condition occurs when, as a result of erase, the floating gate potential is sufficiently high so that during a read operation an unselected cell conducts current, thereby providing an erroneous reading. A solution to the over-erase problem is disclosed in U.S. Pat. No. 4,797,856, the contents of which are incorporated by reference. However, the cell structure disclosed in this patent does not provide a constant preset read current.

Similarly, a split gate Flash memory structure is known to be able to prevent leakage problems even after over-erase. However, the split gate Flash cell cannot deliver a constant read current because for an over-erased cell the channel conduction under the floating gate increases as compared to a cell without over-erase.

Accordingly, it is an object of the present invention to provide a Flash memory cell or an EEPROM memory cell which does not exhibit the over-erase problem and which also delivers a preset constant read current.

SUMMARY OF THE INVENTION

An Electrically Erasable Read Only Memory cell or a Flash memory cell has a self-limiting erase to prevent over-erase and delivers a preset constant read current. The memory cell comprises first and second MOS transistors. The first and second transistors have a common source, first and second separate drains, a common floating gate and a common control gate. The first transistor has a higher threshold voltage than the second transistor. The cell is programmable by introducing a charge into the common floating gate. The cell is erasable by applying a voltage to the common source to discharge the common floating gate. A feedback path is provided between the drain of the second transistor and the common control gate to limit the discharge to prevent over-erasing. The cell can be read by applying a read voltage to the common control gate. Because the erase is limited due to feedback and there is no problem with over-erase, the threshold voltage of the first transistor is constant and known, and a preset constant read current is generated between the common source and the drain of the first transistor.

BRIEF DESCRIPTION OF THE DRAWINGS

FIG. 1 illustrates a Flash memory cell according to the invention.

FIG. 2 illustrates an equivalent circuit for the device of FIG. 1.

FIG. 3 is a table which summarizes conditions for programming, erasing and reading the memory cell of FIGS. 1 and 2.

DETAILED DESCRIPTION OF THE INVENTION

Referring to FIG. 1, a two transistor Flash memory cell is illustrated. The two transistor Flash memory cell 10 comprises a substrate 11 which is formed, for example, from silicon and doped so that it is p-type. A common source 12 is formed on the surface of the substrate 11 and is doped n+-type. There are two drains also formed on the surface of the substrate 11. The first drain 13 is doped n+-type and the second drain 14 is doped n+-type. Illustratively, the substrate 11 is doped with boron. The common source is doped with arsenic and phosphorous (Double-Diffusion Junction) with a concentration of about $10^{20}$ cm$^{-3}$ and has a depth of 0.3–0.5 μm. The drains 13 and 14 are doped with arsenic with a concentration of about $10^{20}$ cm$^{-3}$ and have a depth of 0.2–0.4 μm. In an alternative embodiment of the invention, the substrate may be n-type and the source and drain regions are doped p+-type.

A first channel 15 is formed between the common source 12 and first drain 13. A second channel 16 is formed between the common source 16 and the second drain 14. An oxide layer 17 is formed above the channel regions 15 and 16. The oxide layer 17 has a thickness of about 100 Angstroms above the channel regions and about 500 Angstroms above the n+ type areas. The thicker (~500 Angstroms) oxide is grown on the n+-type regions when the thinner (~100 Angstroms) tunnel oxide is grown over the channels because the n+-type material can enhance the oxidation rate. A common floating gate 18 formed from a first polysilicon layer (poly 1) is formed on the oxide layer 17. The floating gate 18 has a thickness of 1000–2000 Angstroms. A second polysilicon layer 20 (poly 2) which forms a common control gate is separated from the floating gate 18 by an "inter-poly" dielectric layer 19. The dielectric layer 19 may be an oxide layer with a thickness of aboaut 200 Angstroms. Alternatively, the dielectric layer 19 may be "ONO" which is an oxide/nitride/oxide sandwich. In this case, a first oxide layer (not shown) with a thickness of about 100 Angstroms is deposited on the "poly 1" layer 18. Then a nitride layer (not shown) with a thickness of about 100 Angstroms is deposited. A second oxide layer (not shown) with a thickness of about 30 Angstroms is then deposited. After formation of this ONO sandwich, the "poly 2" layer 20 is formed. The second polysilicon layer 20 has a thickness of 200–4000 Angstroms. Contacts to the common source 12, drains 13 and 14, and the common control gate 20 are not shown in FIG. 1. In FIG. 1, the transistor formed by source 12, drain 13, the common floating gate 18 and the common control gate 20 is designated T1. The transistor formed by the source 12, drain 14, the common floating gate 18 and the common control gate 20 is designated T2.

An equivalent circuit of the Flash memory cell 10 of FIG. 1 is illustrated in FIG. 2. In FIG. 2, there are two transistors T1 and T2. The common control gate is designated CG and the common source is designated S1. The drain of the first transistor T1 is designated D1 and the drain of the second transistor T2 is designated D2. In general, the EEPROM cell 10 is located in a two dimensional array of cells. The terminal D1 is connected to a bit line which is also connected to other cells in a column. The control gate CG is part of a word line which is connected to other cells in a row.

The initial threshold voltage $V_{ti1}$ of the transistor T1 is larger than the initial threshold voltage $V_{ti2}$ of transistor T2. For example, $V_{ti1}=1.0$ volts and $V_{ti2}=0$. It is noted that the different $V_{ti}$ values can be set using the conventional process of ion implantation into the channel regions of the two transistors.

The Flash memory cell 10 of FIGS. 1 and 2 may be programmed by storing a charge in the common floating gate of the two transistors. For instance, after programming, the threshold voltage $V_{tp1}$ of transistor T1 is 6 volts and the threshold voltage $V_{tp2}$ of transistor T2 is 5 volts. In general, a technique known as channel hot electron injection may be used to inject electrons from the channel region of a transistor into the floating gate. This can be accomplished in the cell 10 for example by setting D1=7 volts, CG=12 volts, Si=0 volts (grounded), D2 floating.

In an erase operation S1 is set to 12 volts and D1 is floating. The drain D2 is connected to CG via the feedpath path 100 with an initial reset value for CG equal to zero volts. In an illustrative embodiment of the invention, the feedback path 100 includes an impedance element 102. The charge stored in the common floating gate will be pulled out to the source S1 via capacitive coupling across the oxide 17 between the floating gate 18 and the source S1. The threshold voltage of the transistors T1 and T2 will be reduced from their programmed values $V_{tp1}$, $V_{tp2}$ to their initial values $V_{ti1}$, $V_{ti2}$. When the threshold voltage of transistor T2 reaches $V_{ti2}=0$ volts due to erasing, the transistor T2 will turn on and the source voltage of 12 volts will transfer to the control gate CG. This will stop the erase operation since now the voltage across the dielectric layer 17 is very small. At this point, the transistor T1 has a threshold voltage $V_{t1}=1$ Volts. Thus, the erase operation is self limiting and there is no over-erase problem of the type discussed in U.S. Pat. No. 4,797,856.

When the erased cell is read, CG and D1 are set to CG=5 volts, D1=1 volt, S1=0 Volts and D2 is floating. As the threshold voltage of T1 is constant and well known, a constant predetermined read current is delivered between source S1 and drain D1. (Of course when a programmed cell is read, there is no read current because the read voltage CG=5 volts is less than $V_{tp1}=6$ volts of transistor T1).

Thus the inventive Flash memory cell is suitable for high speed applications which need constant high cell current. For a device with self-limiting erase, $V_{t1}$ is preset to a low value (e.g., 0.5 Volts). A lower $V_{t1}$ results in a higher read current. If the self-limiting erase scheme is not used, $V_{t1}$ is higher (e.g., 1.5 Volts) to provide more margin for preventing the device from going into the depletion mode ($V_{t1}<0$) after erase.

Finally, the above-described embodiments of the invention are intended to be illustrative only. Numerous alternative embodiments may be devised by those skilled in the art without departing from the spirit and scope of the following claims.

I claim:

1. A memory cell comprising
a source region and first and second drain regions formed in a semiconductor substrate, said source region being separated from said first and second drain regions by first and second channels,
a floating gate and a control gate overlying said source region and said first and second channels,
said cell be programmable by charging said floating gate,
said cell being erasable by discharging said floating gate, said cell including feedback means connected between said second drain region and said control gate for limiting said discharging,
said cell being readable by applying a read voltage to said control gate to generate a preset constant current between said source region and said first drain region when said cell is erased.

2. The memory cell of claim 1 wherein said feedback means includes an impedance element connected between said second drain region and said control gate.

3. The memory cell of claim 1 wherein a first transistor comprising said source region and said first drain region has a higher threshold voltage than a second transistor comprising said source region and said second drain region.

4. A memory cell comprising
first and second transistors having a common source, first and second separate drains, a common floating gate and a common control gate,
said first transistor having a larger threshold voltage than said second transistor,
said cell be programmable by charging said common floating gate,
said cell being erasable by discharging said common floating gate, said cell including feedback means connected between said second drain and said common control gate to limit said discharging,
said cell being readable by applying a predetermined read voltage to said common control gate and said first drain to cause a predetermined current to flow between said source and said first drain when said cell is erased.

5. A method for operating a memory cell including first and second transistors comprising a common source, first and second drains, a common floating gate, and a common control gate, said first transistor having a higher threshold voltage than said second transistor, said method comprising the steps of:
programming said cell by placing a charge on said common floating gate,
erasing said cell by applying a voltage to said common source to discharge said floating gate and feeding back a voltage at said second drain to said common control gate to limit said discharge, and
reading said cell by applying a read voltage to said common control gate to generate a preset constant current between said common source and said first drain when said cell is erased.

6. A memory cell comprising first and second MOS transistors having a common source, first and second separate drains, a common floating gate and a common control gate, said first transistor having a larger threshold voltage than said second transistor, said cell being erasable by applying a voltage to said common source to discharge said floating gate and feeding back a voltage from said second drain to said common control gate to limit said discharge, said cell being readable by applying a read voltage to said common control gate and generating a preset constant current between said common source and said first drain.

* * * * *